(12) United States Patent
Solven et al.

(10) Patent No.: US 9,134,396 B2
(45) Date of Patent: Sep. 15, 2015

(54) REDUCING BENDING EFFECTS IN TOUCH SENSOR DEVICES

(71) Applicant: Synaptics Incorporated, Santa Clara, CA (US)

(72) Inventors: Derek Solven, San Jose, CA (US); Tracy Scott Dattalo, Santa Clara, CA (US)

(73) Assignee: SYNAPTICS INCORPORATED, Santa Clara, CA (US)

( * ) Notice: Subject to any disclaimer, the term of this patent is extended or adjusted under 35 U.S.C. 154(b) by 246 days.

(21) Appl. No.: 13/798,936

(22) Filed: Mar. 13, 2013

(65) Prior Publication Data

US 2013/0271160 A1 Oct. 17, 2013

Related U.S. Application Data

(60) Provisional application No. 61/625,601, filed on Apr. 17, 2012.

(51) Int. Cl.
*G01R 35/00* (2006.01)
*G01R 27/26* (2006.01)
*G06F 3/044* (2006.01)
*G06F 3/041* (2006.01)

(52) U.S. Cl.
CPC ............ *G01R 35/00* (2013.01); *G01R 27/2605* (2013.01); *G06F 3/041* (2013.01); *G06F 3/044* (2013.01)

(58) Field of Classification Search
CPC .................. G06F 3/044; G06F 3/0412; G06F 2203/04107; G06F 2203/04102
See application file for complete search history.

(56) References Cited

U.S. PATENT DOCUMENTS

| | | | |
|---|---|---|---|
| 2007/0074914 A1* | 4/2007 | Geaghan et al. | 178/18.06 |
| 2009/0267916 A1 | 10/2009 | Hotelling | |
| 2009/0314621 A1 | 12/2009 | Hotelling | |
| 2010/0108409 A1* | 5/2010 | Tanaka et al. | 178/18.06 |
| 2011/0096025 A1* | 4/2011 | Slobodin et al. | 345/174 |
| 2011/0279169 A1* | 11/2011 | Salaverry | 327/517 |
| 2012/0038583 A1* | 2/2012 | Westhues et al. | 345/174 |
| 2012/0162094 A1* | 6/2012 | Kent et al. | 345/173 |
| 2012/0182261 A1* | 7/2012 | Wang et al. | 345/174 |
| 2013/0050139 A1* | 2/2013 | Gute | 345/174 |

* cited by examiner

*Primary Examiner* — Huy Q Phan
*Assistant Examiner* — Adam Clarke
(74) *Attorney, Agent, or Firm* — Patterson & Sheridan, LLP

(57) ABSTRACT

A capacitive image sensor for detecting an input object includes a first substrate and a second substrate. A compressible region is defined between the first substrate and the second substrate. The first substrate is deflectable towards the second substrate. A transmitter electrode, receiver electrode, and bending effect electrode are disposed on the first substrate. The bending effect electrode is disposed between the transmitter electrode and receiver electrode and is configured to reduce a change in resulting signals detected from the receiver electrode caused by deflection of the first substrate towards the second substrate.

24 Claims, 10 Drawing Sheets

REDUCING BENDING EFFECTS IN TOUCH SENSOR DEVICES

CROSS-REFERENCE TO RELATED APPLICATIONS

This application claims benefit of U.S. provisional patent application Ser. No. 61/625,601, filed Apr. 17, 2012, which is herein incorporated by reference.

BACKGROUND OF THE INVENTION

1. Field of the Invention

Embodiments of the present invention generally relate to a system and method for sensing an input object's position over a sensing region of a proximity sensing device.

2. Description of the Related Art

Input devices including proximity sensor devices, also commonly called touchpads or touch sensor devices, are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems, such as opaque touchpads integrated in, or peripheral to, notebook or desktop computers. Proximity sensor devices are also often used in smaller computing systems, such as touch screens integrated in cellular phones.

Proximity sensor devices are typically used in combination with other supporting components, such as display or input devices found in the electronic or computing system. In some configurations, the proximity sensor devices are coupled to these supporting components to provide a desired combined function or to provide a desirable complete device package. Many commercially available proximity sensor devices utilize one or more electrical techniques to determine the presence, location and/or motion of an input object, such as a capacitive or a resistive sensing technique. Typically, the proximity sensor devices utilize an array of sensor electrodes to detect the presence, location and/or motion of an input object.

SUMMARY OF THE INVENTION

Embodiments of the invention generally provide an input device having a reduced sensitivity to the effects of bending or deflection of the input device. Embodiments of the invention generally provide an input device having a first substrate on which transmitter and receiver electrodes are disposed, and a second substrate displaced from the first substrate to form a compressible region. The first substrate is deflectable between a first position in which the compressible region has a first thickness and a second position in which the compressible region has a second thickness that is less than the first thickness. When the transmitter electrode is driven with a voltage, resulting signals are received from the receiver electrode and are processed to detect the presence of an input object in an area proximate to the input device. A bending effect electrode is disposed between the transmitter and receiver electrodes. The bending effect electrode helps to reduce or remove unwanted changes in resulting signals caused by deflection of the first substrate towards the second substrate.

Embodiments of the invention may provide an input device having a processing system for receiving and processing resulting signals. The input device comprises a first substrate, and a second substrate displaced from the first substrate to form a compressible region. Transmitter and receiver electrodes are disposed on the first substrate. Bending effect electrodes are disposed between the transmitter and receiver electrodes for reducing or removing unwanted changes in resulting signals caused by deflection of the first electrode towards the second electrode. A processing system is configured to drive the transmitter electrodes with a voltage and to receive resulting signals from receiver electrodes. In various embodiments, the processing system may hold the bending effect electrode at a ground voltage, at a reference voltage, or may vary the voltage of the bending effect electrode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
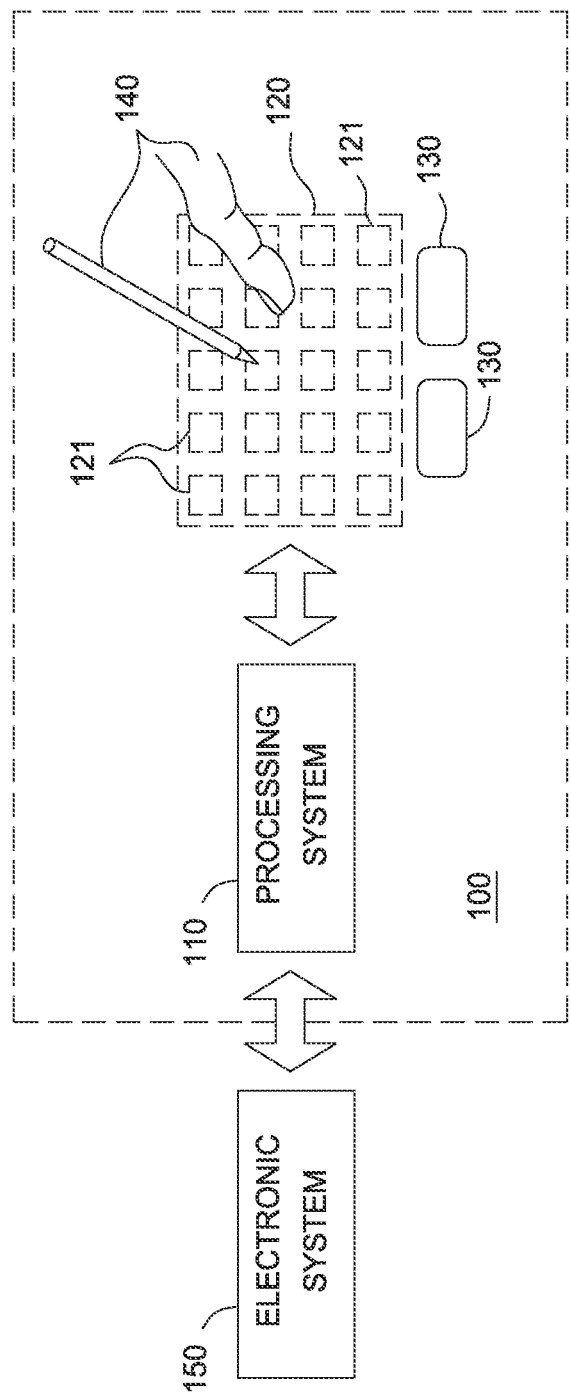
FIG. 1 is a schematic block diagram of an exemplary input device, in accordance with embodiments of the invention.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Typically, input devices include one or more sensing electrodes that provide information about the location of an input object. The sensing electrodes may be attached or disposed on one or more substrate surfaces for physical support and for integration with other electronic devices. When an input object is brought into a sensing region, the input object may come into physical contact with one or more portions of the sensing device, for example, a glass cover of the sensing device. This physical contact may provide a force to the input device, which causes the sensing device (e.g., substrate layers of the input device) to bend or deflect, thereby changing the physical and/or electrical characteristics of sensing electrodes attached or disposed on the substrates. This change in the physical and/or electrical characteristics of the sensing electrodes may result in an alteration of a signal received from the sensing electrodes, referred to as a "bending effect". Alteration of the received signals due to bending of the input device may result in difficulty in detecting the presence of an input object.

Therefore, according to one embodiment, a bending effect electrode is disposed between sensor electrodes to reducing the amount of change in a resulting signal received from the sensing electrodes caused by the bending or deflection of the sensing device. The bending effect electrode functions to reduce the amount of capacitive coupling between sensor electrodes that is affected by bending or deflection of the sensing device, and is described in more detail below.

FIG. 1 is a block diagram of an exemplary input device 100, in accordance with embodiments of the invention. In FIG. 1, the input device 100 is a proximity sensor device (e.g., "touchpad," "touch screen," "touch sensor device") configured to sense inputs provided by one or more input objects 140 positioned in a sensing region 120. Example input objects include fingers and styli, as shown in FIG. 1. In some embodiments of the invention, the input device 100 may be configured to provide input to an electronic system 150, which is sometime referred to herein as the "host." As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional examples of electronic systems include composite input devices, such as physical keyboards that include input device 100 and separate joysticks or key switches. Further examples of electronic systems 150 include peripherals, such as data input devices (e.g., remote controls and mice) and data output devices (e.g., display screens and printers). Other examples include remote terminals, kiosks, video game machines (e.g., video game consoles, portable gaming devices, and the like), communication devices (e.g., cellular phones, such as smart phones), and media devices (e.g., recorders, editors, and players such as televisions, set-top boxes, music players, digital photo frames, and digital cameras). Additionally, the electronic system could be a host or a slave to the input device.

The input device 100 can be implemented as a physical part of the electronic system 150, or can be physically separate from the electronic system. As appropriate, the input device 100 may communicate with parts of the electronic system 150 using any one or more of the following: buses, networks, and other wired or wireless interconnections. Examples include I²C, SPI, PS/2, Universal Serial Bus (USB), Bluetooth, RF, and IRDA.

Sensing region 120 encompasses any space above, around, in and/or near the input device 100 in which the input device 100 is able to detect user input by one or more input objects 140. The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements 121 for detecting user input. As several non-limiting examples, the one or more sensing elements 121 in the input device 100 may use capacitive, elastive, resistive, inductive, magnetic acoustic, ultrasonic, and/or optical techniques to detect the position or motion of the input object(s) 140. Some implementations are configured to provide sensing images that span one, two, three, or higher dimensional spaces.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. In some embodiments, the processing system 110 also comprises electronically-readable instructions, such as firmware code, software code, and/or the like. In some embodiments, components composing the processing system 110 are located together, such as near sensing element(s) 121 of the input device 100. In other embodiments, components of processing system 110 are physically separate with one or more components close to sensing elements 121 of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the input device 100. Each module may comprise circuitry that is a part of the processing system 110, firmware, software, or a combination thereof. In various embodiments, different combinations of modules may be used. In one example, modules include hardware operation modules for operating hardware such as sensing elements and display screens, data processing modules for processing data, such as sensor signals, and positional information, and reporting modules for reporting information. In another example, modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. In one example, as noted above, actions may include changing operation modes, as well as GUI actions, such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system process information received from the processing system 110 is used to act on user input, such as to facilitate a full range of actions, including mode changing actions and GUI actions. For example, in some embodiments, the processing system 110 operates the sensing element(s) 121 of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensing elements 121. As another example, the processing system 110 may perform filtering or other signal conditioning. As yet another example, the processing system 110 may subtract or otherwise account for a baseline set of data (e.g., baseline image), such that the information reflects a difference between the acquired electrical signals (e.g., sensing image) and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen of a display device (not shown). For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display device may share physical elements. Some embodiments of the input device 100 include at least part of the display device. For example, some embodiments may utilize some of the same electrical components for displaying and sensing. In some examples, the display screen of the display device may be operated in part or in total by the processing system 110.

It should be understood that while many embodiments of the present technology are described in the context of a fully functioning apparatus, the mechanisms of the present technology are capable of being distributed as a program product (e.g., software) in a variety of forms. For example, the mechanisms of the present technology may be implemented and distributed as a software program on information bearing media that are readable by electronic processors (e.g., non-transitory computer-readable and/or recordable/writable information bearing media readable by the processing system 110). Additionally, the embodiments of the present technology apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

In many embodiments, the positional information of the input object 140 relative to the sensing region 120 is monitored or sensed by use of one or more sensing elements 121 (FIG. 1) that are positioned to detect its "positional information." In general, the sensing elements 121 may comprise one or more sensing elements or components that are used to detect the presence of an input object. As discussed above, the one or more sensing elements 121 of the input device 100 may use capacitive, elastive, resistive, inductive, magnetic acoustic, ultrasonic, and/or optical techniques to sense the positional information of an input object. While the information presented below primarily discuses the operation of an input device 100, which uses capacitive sensing techniques to monitor or determine the positional information of an input object 140 this configuration is not intended to be limiting as to the scope of the invention described herein, since other sensing techniques may be used.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements pick up loop currents induced by a resonating coil or pair of coils. Some combination of the magnitude, phase, and frequency of the currents may then be used to determine positional information.

In one embodiment of the input device 100, the sensing element 121 is a capacitive sensing element that is used to sense the positional information of the input object(s). In some capacitive implementations of the input device 100, voltage or current is applied to the sensing elements to create an electric field between an electrode and ground. Nearby input objects 140 cause changes in the electric field, and produce detectable changes in capacitive coupling that may be detected as changes in voltage, current, or the like. Some capacitive implementations utilize arrays or other regular or irregular patterns of capacitive sensing elements to create electric fields. In some capacitive implementations, portions of separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between one or more sensing elements, or one or more sensor electrodes, and an input object. In various embodiments, an at least partially grounded input object positioned near the sensor electrodes alters the electric field near the sensor electrodes, thus changing the measured capacitive coupling of the sensor electrodes to ground. In one implementation, an absolute capacitance sensing method operates by modulating sensor electrodes with respect to a reference voltage (e.g., system ground), and by detecting the capacitive coupling between the sensor electrodes and the at least partially grounded input object(s).

Some capacitive implementations utilize "mutual capacitance" (or "transcapacitance") sensing methods based on changes in the capacitive coupling between two or more sensing elements (e.g., sensor electrodes). In various embodiments, an input object near the sensor electrodes alters the electric field created between the sensor electrodes, thus changing the measured capacitive coupling. In one implementation, a transcapacitive sensing method operates by detecting the capacitive coupling between one or more transmitter sensor electrodes (also "transmitter electrodes," "transmitting electrodes" or "transmitters") and one or more receiver sensor electrodes (also "receiver electrodes" or "receiving electrodes"). Transmitter sensor electrodes may be modulated relative to a reference voltage (e.g., system ground) to transmit transmitter signals. Receiver sensor electrodes may be held substantially constant relative to the reference voltage to facilitate receipt of "resulting signals." A "resulting signal" may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive. In some implementations user input from an actively modulated device (e.g. an active pen) may act as a transmitter such that each of the sensor electrodes act as a receiver to determine the position of the actively modulated device.

Most conventional multi-touch sensing sensor devices, in which the location of more than one finger or other input can be accurately determined, comprise a matrix of transmitter sensor electrodes and receiver sensor electrodes. Conventionally, during operation, capacitive images are formed by measuring the capacitance formed between each transmitter and receiver sensor electrode (referred to as "transcapacitance" or "mutual capacitance"), forming a matrix or grid of capacitive detecting elements across the sensing region 120. The presence of an input object (such as a finger or other object) at or near an intersection between transmitter and receiver sensor electrodes changes the measured "transcapacitance". These changes are localized to the location of object, where each transcapacitive measurement is a pixel of a "capacitive image" and multiple transcapacitive measurements can be utilized to form a capacitive image of the object.

Herein sensor design and sensing scheme embodiments are described that allow the creation of 2-D capacitance images using a single sensing layer in which all of the transmitting and receiving sensor electrodes are disposed in a single common layer with one another without the use of jumpers within the sensor area. The electronics to drive the sensor are located in a processing system, such as processing system 110 described herein. These described embodiments also facilitate contact sensing, proximity sensing, and position sensing. These described embodiments also facilitate "multi-touch" sensing, such as two finger rotation gestures and two finger pinch gestures, but with a less expensive sensor compared to a sensor that utilizes sensor electrodes in multiple layers. The reduced number of layers used to form the input device described herein versus other conventional position sensing devices also equates to fewer production steps, which in itself will reduce the production cost of the device. The reduction in the layers of the input device also decreases interference or obscuration of an image or display that is viewed through the sensor, thus lending itself to improved optical quality of the formed input device when it is integrated with a display device. Additional electrodes involved in sensing the shape of the electric fields of the transmitters and receivers, such as floating electrodes or shielding electrodes, may be included in the device and may be placed on other substrates or layers. The electrodes may be part of a display (share a substrate) and may even share functionality with the display (used for both display and sensing functionality). For example electrodes may be patterned in the Color filter of an LCD (Liquid Crystal Display) or on the sealing layer of an OLED (Organic Light Emitting Diode) display. Alternately, sensing electrodes within the display or on TFT (Thin Film Transistor) layer of an active matrix display may also be used as gate or source drivers. Such electrodes may be patterned (e.g. spaced or oriented at an angle relative to the pixels) such that they minimize any visual artifacts. Furthermore, they may use hiding layers (e.g. Black Mask between pixels) to hide at least some portion of one or more conductive electrodes.

Figure 2A:
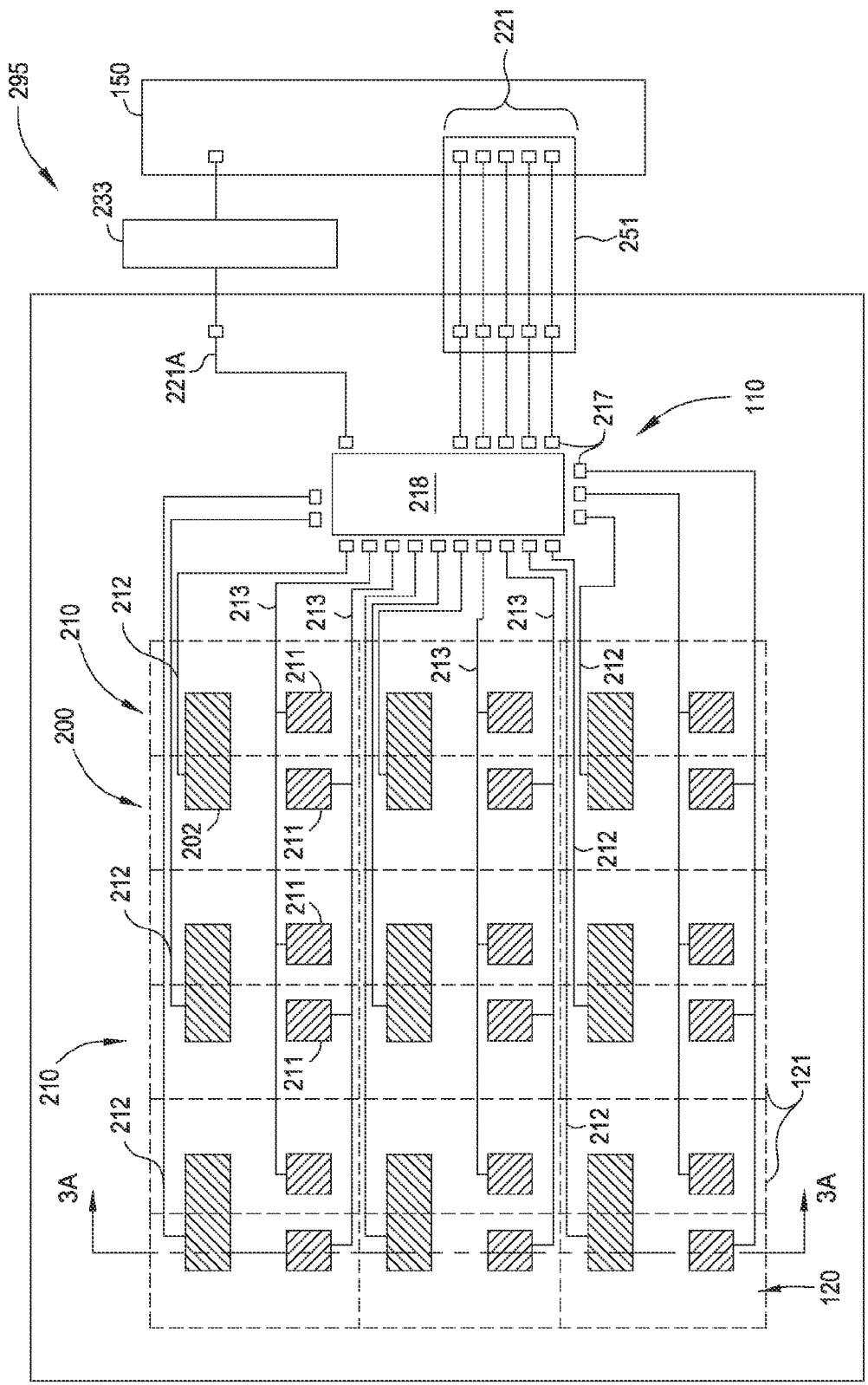
FIG. 2A is a schematic diagram illustrating an input device, according to one or more of the embodiments described herein.

FIG. 2A is a schematic top view of a portion of an input device 295 that illustrates a portion of a sensor electrode pattern that may be used to sense the positional information of an input object within the sensing region 120 using a transcapacitive sensing method. One will note that the input device 295 may be formed as part of a larger input device 100, which is discussed above. In general, the sensor electrode pattern disclosed herein comprises a sensor array set 200 that includes a plurality of sensor electrode arrays 210 that include a plurality of sensor electrodes, such as sensor electrodes 202 and 211. For clarity of illustration and description, while FIG. 2A illustrates a pattern of simple rectangles used to represent the sensor electrodes, this configuration is not meant to be limiting and in other embodiments, various other sensor electrode shapes may be used as discussed further herein. In some embodiments, sensing elements 121 comprise two or more sensor electrodes, for example, sensor electrodes 202 and 211 that may be similar or different in size and/or shape. In one example, as shown, these sensor electrodes are disposed in a sensor electrode pattern that comprises a first plurality of sensor electrodes 202 and a second plurality of sensor electrodes 211, which are disposed on the same layer as the first plurality of sensor electrodes 202. Sensor electrodes 202 and sensor electrodes 211 are typically ohmically isolated from each other, by use of insulating materials or a physical gap formed between the electrodes to prevent them from electrically shorting to each other. One will note that the sensor electrode pattern of FIG. 2A may alternatively utilize various sensing techniques, such as mutual capacitive sensing, absolute capacitive sensing, elastive, resistive, inductive, magnetic acoustic, ultrasonic, or other useful sensing techniques, without deviating from the scope of the invention described herein. Sensor electrode 202 may be be a transmitter and 211 may be a receiver, or vice versa (the other way around) with typically similar imaging capability.

In one embodiment, as illustrated in FIG. 2A, the sensing elements 121 may comprise a plurality of transmitter and receiver electrodes that are formed in a single layer on a surface of a substrate. In one configuration of the input device 295, each of the sensor electrodes may comprise one or more transmitter electrodes (e.g. sensor electrodes 202) that are disposed proximate to one or more receiver electrodes (e.g. sensor electrodes 211). In one example, a transcapacitive sensing method using the single layer sensor electrode design, may operate by detecting the change in capacitive coupling between one or more of the driven transmitter sensor electrodes and one or more of the receiver electrodes, as similarly discussed above. In such embodiments, the transmitter and receiver electrodes may be disposed in such a way that jumpers and/or extra layers used to form the area of capacitive pixels are not required. In various embodiments, the transmitter electrodes and receiver electrodes may be formed in an array on the surface of a substrate by first forming a blanket conductive layer on the surface of the substrate and then performing an etching and/or patterning process (e.g., lithography and wet etch, laser ablation, etc.) that ohmically isolates each of the transmitter electrodes and receiver electrodes from each other. In other embodiments, the sensor electrodes may be patterned using deposition and screen printing methods. As illustrated in FIG. 2A, these sensor electrodes may be disposed in an array that comprises a rectangular pattern of sensing elements 121, which may comprise one or more transmitter electrodes and one or more receiver electrodes. In one example, the blanket conductive layer used to form the transmitter electrodes and receiver electrodes comprises a thin metal layer (e.g., copper, aluminum, etc.) or a thin transparent conductive oxide layer (e.g., ATO, ITO, Zinc oxide) that is deposited using convention deposition techniques known in the art (e.g., PVD, CVD). In various embodiments, patterned isolated conductive electrodes (e.g., electrically floating electrodes) may be used to improve visual appearance. In one or more of the embodiments described herein, the sensor electrodes are formed from a material that is substantially optically clear, and thus, in some configurations, can be disposed between a display device and the input device user.

The areas of localized capacitive coupling formed between at least a portion of one or more sensor electrodes 202 and at least a portion of one or more sensor electrodes 211 may be termed a "capacitive pixel," or also referred to herein as the sensing element 121. For example, as shown in FIG. 2A, the capacitive coupling in a sensing element 121 may be created by the electric field formed between at least a portion of the sensor electrodes 202 and a sensor electrode 211, which changes as the proximity and motion of input objects across the sensing region changes.

In some embodiments, the sensing elements 121 are "scanned" to determine these capacitive couplings. The input device 295 may be operated such that one transmitter electrode transmits at one time, or multiple transmitter electrodes transmit at the same time. Where multiple transmitter electrodes transmit simultaneously, these multiple transmitter electrodes may transmit the same transmitter signal and produce an effectively larger transmitter electrode, or these multiple transmitter electrodes may transmit different transmitter signals. In one example, the transmitter electrodes are the sensor electrodes 202 and the receiver electrodes are the sensor electrodes 211. For example, in one configuration, multiple sensor electrodes 202 transmit different transmitter signals according to one or more coding schemes that enable their combined effects on the resulting signals received by the receiving sensor electrodes, or sensor electrodes 211, to be independently determined. The direct effect of a user input which is coupled to the device may affect (e.g. reduce the fringing coupling) the resulting signals. Alternately, a floating electrode may be coupled to the input and to the transmitter and receiver and the user input may lower its impedance to system ground and thus reduce the resulting signals. In a further example, a floating electrode may be displaced toward the transmitter and receiver which increases their relative coupling. The receiver electrodes, or a corresponding sensor electrode 211, may be operated singly or multiply to acquire resulting signals created from the transmitter signal. The resulting signals may be used to determine measurements of the capacitive couplings at the capacitive pixels, which are used to determine whether an input object is present and its positional information, as discussed above. A set of values for the capacitive pixels form a "capacitive image" (also "capacitive frame" or "sensing image") representative of the capacitive couplings at the pixels. In various embodiments, the sensing image, or capacitive image, comprises data received during a process of measuring the resulting signals received with at least a portion of the sensing elements 121 distributed across the sensing region 120. The resulting signals may be received at one instant in time, or by scanning the rows and/or columns of sensing elements distributed across the sensing region 120 in a raster scanning pattern (e.g., serially polling each sensing element separately in a desired scanning pattern), row-by-row scanning pattern, column-by-column scanning pattern or other useful scanning technique. In many embodiments, the rate that the "sensing image" is acquired by the input device 100, or sensing frame rate, is between about 60 and about 180 Hertz (Hz), but can be higher or lower depending on the desired application.

In some touch screen embodiments, the sensing elements 121 are disposed on a substrate of an associated display device. For example, the sensor electrodes 202 and/or the sensor electrodes 211 may be disposed on a polarizer, a color filter substrate, or a glass sheet of an LCD. As a specific example, the sensor electrodes 202 and 211 may be disposed on a TFT (Thin Film Transistor) substrate of an LCD type of the display device, a color filter substrate, on a protection material disposed over the LCD glass sheet, on a lens glass (or window), and the like. The electrodes may be separate from and in addition to the display electrodes, or shared in functionality with the display electrodes. Similarly, an extra layer may be added to a display substrate or an additional process such as patterning applied to an existing layer.

In some touchpad embodiments, the sensing elements 121 are disposed on a substrate of a touchpad. In such an embodiment, the sensor electrodes in each sensing element 121 and/or the substrate may be substantially opaque. In some embodiments, the substrate and/or the sensor electrodes of the sensing elements 121 may comprise a substantially transparent material.

In those embodiments, where sensor electrodes of each of the sensing elements 121 are disposed on a substrate within the display device (e.g., color filter glass, TFT glass, etc.), the sensor electrodes may be comprised of a substantially transparent material (e.g., ATO, ClearOhm™) or they may be comprised of an opaque material and aligned with the pixels of the display device. Electrodes may be considered substantially transparent in a display device if their reflection (and/or absorption) of light impinging on the display is such that human visual acuity is not disturbed by their presence. This may be achieved by matching indexes of refraction, making opaque lines narrower, reducing fill percentage or making the percentage of material more uniform, reducing spatial patterns (e.g. moire') that are with human visible perception, and the like.

In one configuration, as illustrated in FIG. 2A and further discussed below, the processing system 110 of the input device 295 comprises a sensor controller 218 that is coupled through connectors 217 to each of the transmitter and receiver electrodes, such as sensor electrodes 202 and 211, through one or more traces (e.g., traces 212 and 213) respectively. In one embodiment, the sensor controller 218 is generally configured to transmit the transmitter signal and receive the resulting signals from receiver electrodes. The sensor controller 218 is also generally configured to communicate the positional information received by the sensing elements 121 to the electronic system 150 and/or the display controller 233, which is also coupled to the electronic system 150. The sensor controller 218 may be coupled to the electronic system 150 using one or more traces 221 that may pass through a flexible element 251 and be coupled to the display controller 233 using one or more traces 221A that may pass through the same flexible element 251 or a different connecting element, as shown. While the processing system 110 illustrated in FIG. 2A schematically illustrates a single component (e.g., IC device) to form the sensor controller 218, the sensor controller 218 may comprise two or more controlling elements (e.g., IC devices) to control the various components in the processing system 110 of the input device 295. The controller devices may be placed onto display substrates such as TFT or Color Filter/Sealing layers (e.g. as a Chip On Glass).

In one configuration, the functions of the sensor controller 218 and the display controller 233 may be implemented in one integrated circuit that can control the display module elements and drive and/or sense data delivered to and/or received from the sensor electrodes. In various embodiments, calculation and interpretation of the measurement of the resulting signals may take place within the sensor controller 218, display controller 233, a host electronic system 150, or some combination of the above. In some configurations, the processing system 110 may comprise a transmitter circuitry, receiver circuitry, and memory that is disposed within one or any number of ICs found in the processing system 110, depending to the desired system architecture.

Figure 2B:
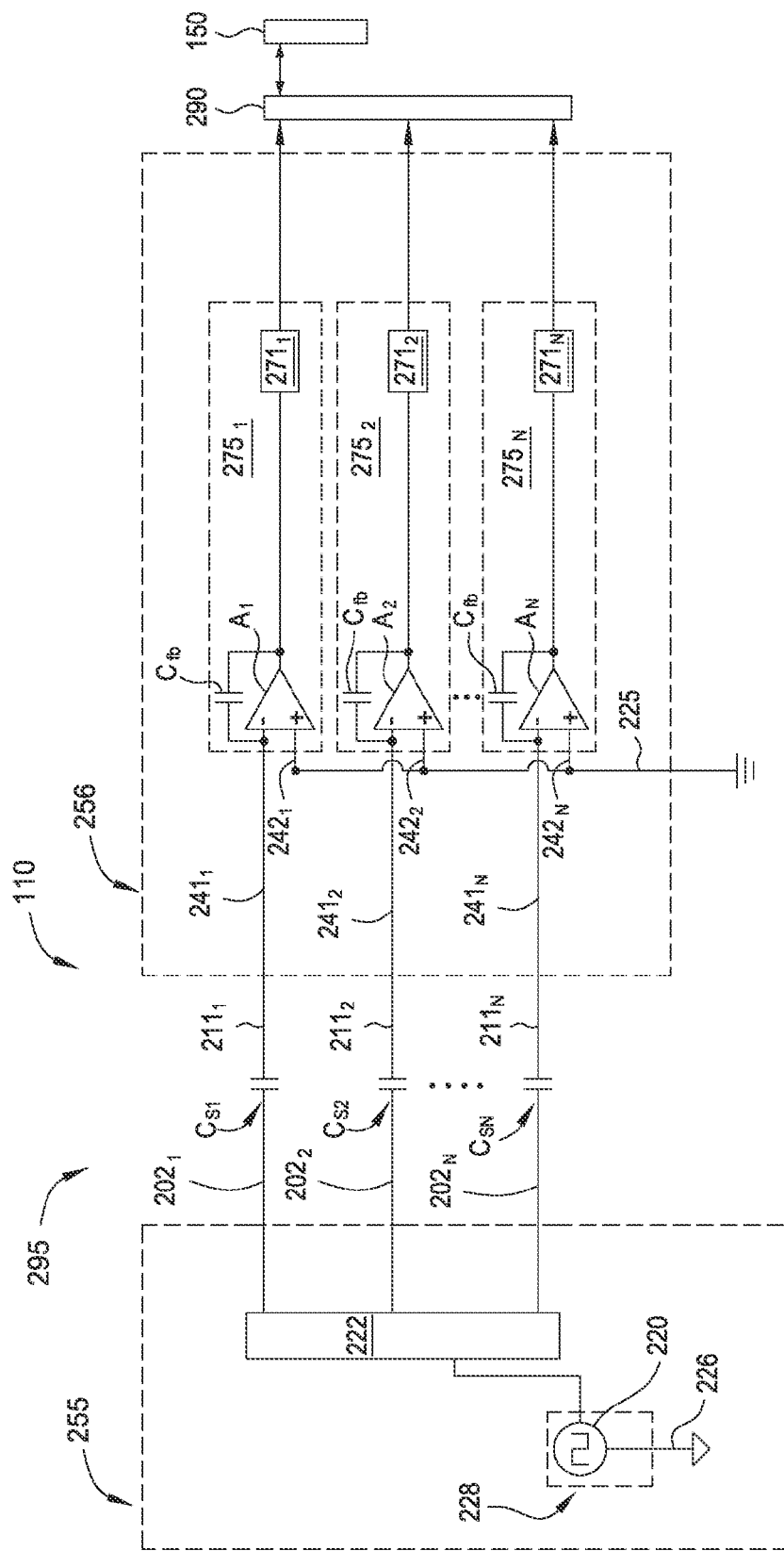
FIG. 2B is a schematic diagram illustrating a portion of an input device, according to one or more of the embodiments described herein.

FIG. 2B is a schematic view of a portion of the processing system 110 of the input device 295 according to one or more of the embodiments described herein. In one configuration, the sensor controller 218 includes a signal generating processor 255 and sensor processor 256 that work together to provide touch sensing data to an analysis module 290 and the electronic system 150. The analysis module 290 may be part of the processing system 110, the sensor processor 256 and/or part of the electronic system 150. In various embodiments, the analysis module 290 comprises digital signal processing elements and/or other useful digital and analog circuit elements that are connected together to process the receiver channel output signal(s) received from at least one receiver channel that is coupled to a receiver electrode, and also provide processed signals to other portions of the electronic system 150. The electronic system 150 can then use the processed signals to control some aspect of the input device 295, such as send a message to the display, perform some calculation or software related task based on instructions created by one or more software programs that are being run by the electronic system and/or perform some other function.

As illustrated in FIG. 2B, the processing system 110 may comprise a signal generating processor 255 and a sensor processor 256 that work together to provide receiver channel output signals to the analysis module 290 and/or the electronic system 150. As discussed above, the positional information of an input object 140 (FIG. 1) is derived based on the capacitance $C_S$ (e.g., capacitance $C_{S1}, C_{S2}, \ldots C_{SN}$) measured between each of the transmitter electrodes (e.g., sensor electrodes $202_1, 202_2, \ldots 202_N$) and the receiver electrodes (e.g., sensor electrodes $211_1, 211_2, \ldots 211_N$).

In one embodiment, as shown in FIG. 2B, the signal generating processor 255 comprises a driver 228, which is adapted to deliver capacitive sensing signals (transmitter signals) to the transmitter electrodes. In one configuration, the driver 228 may comprise a power supply and signal generator 220 that is configured to deliver a square, rectangular, trapezoidal, sinusoidal, Gaussian or other shaped waveforms used to form the transmitter signal(s) to the transmitter electrodes. In one configuration, the signal generator 220 comprises an electrical device, or simple switch, that is able to deliver a transmitter signal that transitions between the output level of the power supply and a low display voltage level. In various embodiments, signal generator 220 may comprise an oscillator. In some configurations, the signal generator 220 is integrated into the driver 222, which includes one or more shift registers (not shown) and/or switches (not shown) that are adapted to sequentially deliver transmitter signals to one or more of the transmitter electrodes at a time.

In one embodiment, as shown in FIG. 2B, the sensor processor 256 comprises a plurality of receiver channels 275 (e.g., receiver channels $275_1, 275_2, \ldots 275_N$) that each have a first input port 241 (e.g., ports $241_1, 241_2, \ldots 241_N$) that is configured to receive the resulting signal received with at least one receiver electrode (e.g., sensor electrode $211_1, 211_2, \ldots 211_N$), a second input port (e.g., ports $242_1, 242_2, \ldots 242_N$) that is configured to receive a reference signal delivered through the line 225, and an output port coupled to the analysis module 290 and electronic system 150. Typically, each receiver channel 275 is coupled to a single receiver electrode. Each of the plurality of receiver channels 275 may include a charge accumulator, supporting components 271 (e.g., components $271_1, 271_2, \ldots 271_N$) such as demodulator circuitry, a low pass filter, sample and hold circuitry, other useful electronic components filters and analog/digital converters (ADCs) or the like. The analog/digital converter (ADC) may comprise, for example, a standard 8, 12 or 16 bit ADC that is adapted to receive an analog signal and deliver a digital signal (receiver channel output signal) to the analysis module 290 (e.g. a Successive Approximation ADC, a Sigma-Delta ADC, an Algorithmic ADC, etc). In one configuration, the charge accumulator includes an integrator type operational amplifier (e.g., Op Amps $A_1$-$A_N$) that has an integrating capacitance $C_{fb}$ that is coupled between the inverting input and the output of the device. Due to the type of electronic elements required to detect and process the received resulting signals, the cost required to form each receiver channel 275 is generally more expensive than the cost required to form the components in the signal generating processor 255 that provides the transmitter signal(s) to a transmitter electrode(s).

Figure 3A:
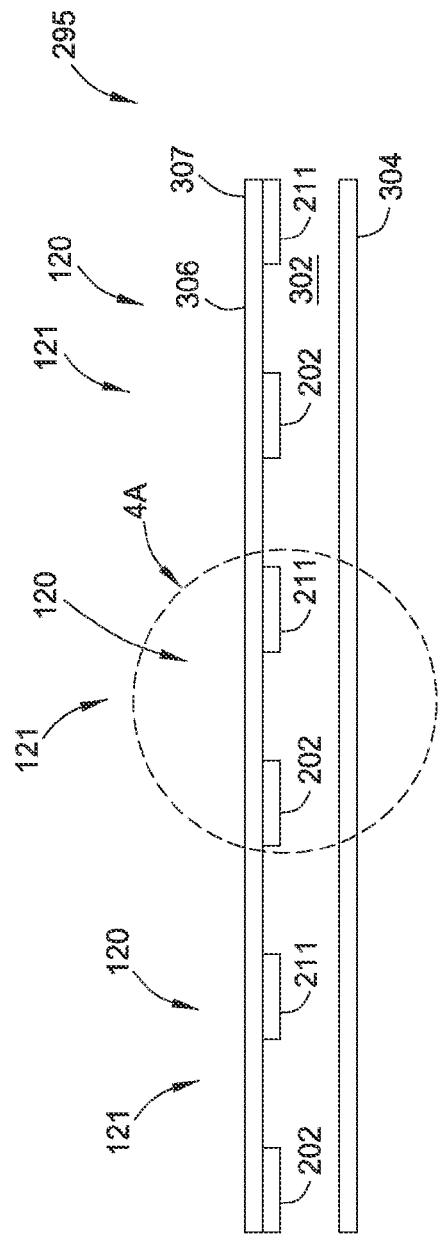
FIG. 3A is a cross-sectional view of the input device shown in FIG. 2A, according to one embodiment of the present invention.

FIG. 3A is a cross-sectional view of an input device 295 shown in FIG. 2A, according to one embodiment of the present invention. As shown, the transmitter electrodes 202 and receiver electrodes 211 are disposed on a first substrate 306, which is spaced apart from a second substrate 304 to form a compressible region 302. In some embodiments, the compressible region 302 is an air gap or a compressible substance. In some embodiments, the second substrate 304 includes or is a portion of a display. In other embodiments, the second substrate 304 comprises any other driven or grounded electrode or element that is below the compressible region 302, such as a grounded plate or common voltage (VCOM) electrode. Further, the first substrate 306 can comprise one or more layers, such as a cover layer, optical layer, adhesives, or optical coatings. In some embodiments, transmitter electrodes 202 and receiver electrodes 211 can be deposited directly on the first substrate 306 or on a separate substrate layer that is disposed on the first substrate 306. Transmitter electrodes 202 and receiver electrodes 211 may also be disposed in a common layer such that the transmitter electrodes 202 do not cross the receiver electrodes 211 in the sensing region 120. In other embodiments, transmitter electrodes 202 and receiver electrodes 211 are disposed on a first layer and jumpers are disposed on a second layer. Transmitter electrodes 202 and receiver electrodes 211 may have various shapes and sizes, for example, as discussed later in conjunction with FIGS. 9A and 9B.

Figure 3B:
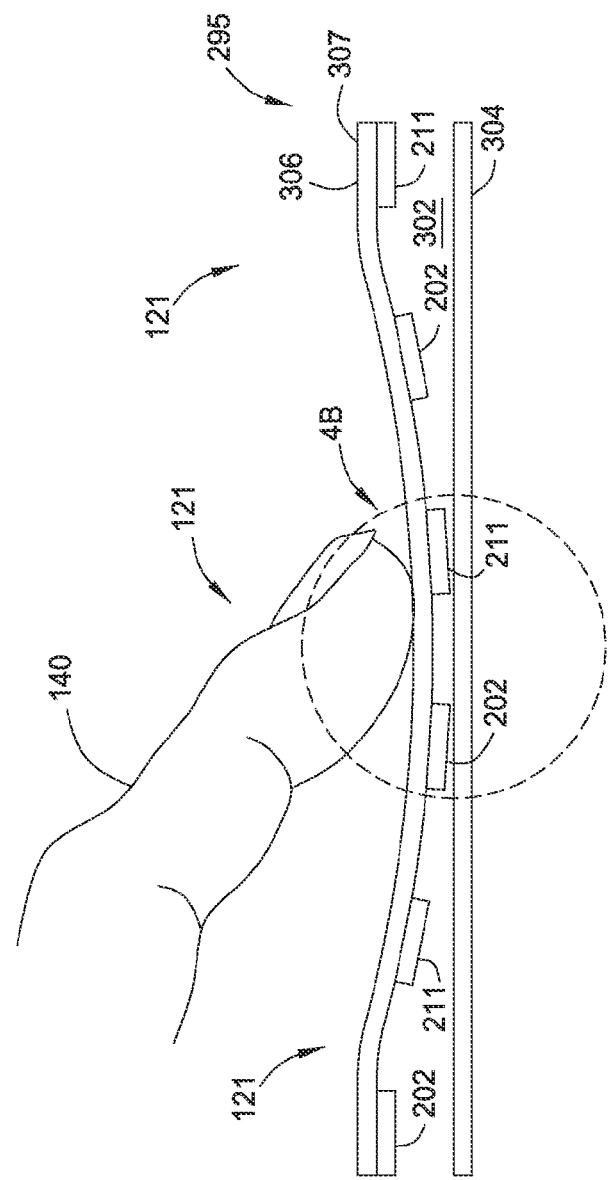
FIG. 3B illustrates the cross-sectional view of the input device shown in FIG. 2A, having an amount of bending applied, according to one embodiment of the present invention.

FIG. 3B illustrates the cross-sectional view of the input device shown in FIG. 2A, having an amount of bending applied, according to one embodiment of the present invention. As shown, the input object 140 (e.g., a human finger) applies a pressure to the first substrate 306, causing the first substrate 306 to deflect towards the second substrate 304. The shortened distance between the second substrate 304 and the sensor electrodes 202, 211 on the first substrate 306 causes a change in the capacitive coupling between the transmitter electrodes 202 and the receiver electrodes 211, referred to herein as a "bending effect," which affects resulting signals received during transcapacitive sensing. For example, the changed capacitive coupling between transmitter electrodes 202 and receiver electrodes 211 causes an unwanted contribution to the resulting signal received when transmitter electrode 202 is driven for transcapacitive sensing, making it more difficult to discern certain information from the resulting signal, such as presence or location of an input object 140. In another example, the changed capacitive coupling between the transmitter electrodes 202 and the receiver electrodes 211 may create a "false" signal when pressure to the input device 295 is applied with a non-conductive object. The changes to resulting signals caused by the shortened distance between the electrodes 202, 211 and the second substrate 304 are discussed in more detail below with respect to FIGS. 4A and 4B.

Figure 4A:
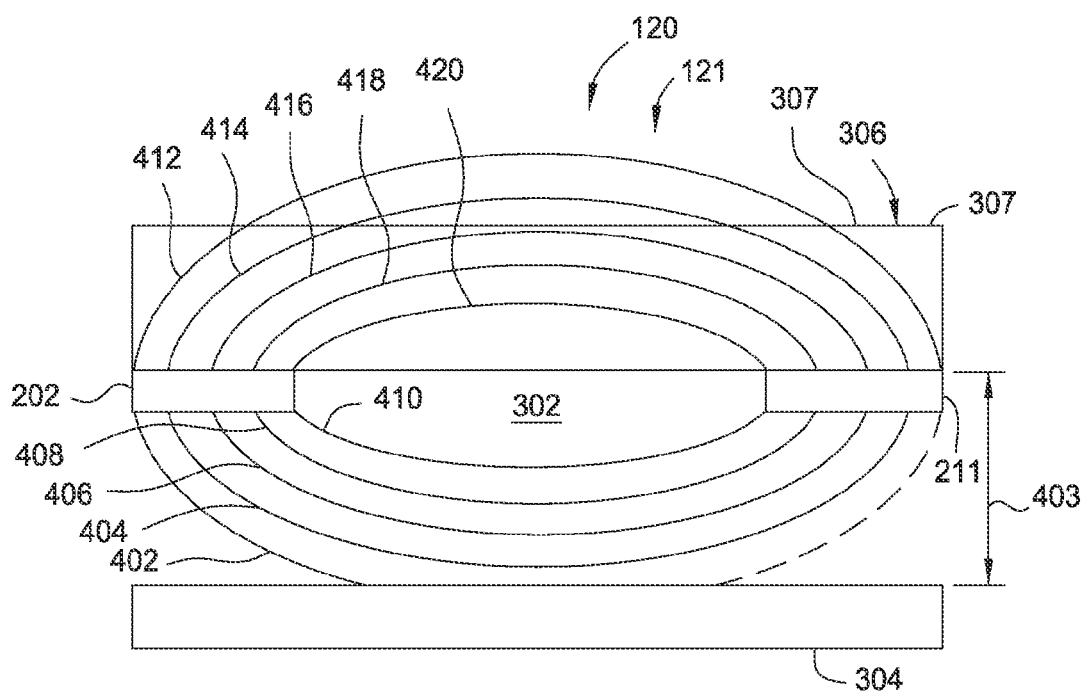
FIG. 4A is an enlarged view of a sensing element in the input device shown in FIGS. 2A and 3A, according to one embodiment of the present invention.

FIG. 4A is an enlarged view of a sensing element 121 in the input device 295 shown in FIGS. 2A and 3A, according to one embodiment of the present invention. As shown, the sensing element 121 includes a transmitter electrode 202, a receiver electrode 211, a first substrate 306, and a second substrate 304. The first substrate 306 and the second substrate 304 are spaced apart and at a distance 403 from each other, to form compressible region 302.

During operation, transmitter electrode 202 is driven with a transmitter signal causing capacitive coupling between transmitter electrode 202 and other components in input device 295. An electric field represented by electric field lines shown in FIG. 4A forms as the result of driving the transmitter electrode 202. The geometry of the electric field lines shown in FIG. 4A is affected by the distance 403 from the first substrate 306 to the second substrate 304. Field lines may be categorized based on the components that the field lines connect and the elements through which the field lines extend. Field lines 404, 406, 408, and 410 extend through the compressible region 302 and capacitively couple the transmitter electrode 202 to the receiver electrode 211. Field lines 412, 414, 416, 418, and 420 extend through the first substrate 306 and capacitively couple the transmitter electrode 202 to the receiver electrode 211. Field line 402 capacitively couples the transmitter electrode 202 to the second substrate 304. For the purposes of this disclosure, field lines may be categorized as "near-field lines" and "far-field lines." Near field lines extend from the transmitter electrode 202 to the receiver electrode 211, either above or below the transmitter electrode 202 and the receiver electrode 211, but do not approach or extend past a touch surface 307. Far field lines above the transmitter electrode 202 and the receiver electrode 211 are lines that extend from the transmitter electrode 202 to the receiver electrode 211, and approach or extend past touch surface 307. Far field lines below the transmitter electrode 202 and the receiver electrode 211 extend from the transmitter electrode 202 to the second substrate 304. Far field lines include lines 412, 414, 416 and 402, and near field lines include lines 418, 420, 404, 406, 408, and 410. Dotted lines represent portions of electric field lines that would have formed if not for the proximity of the second substrate 304.

During operation, if an input object 140 is present in a sensing region 120, the input object may interact with an electrical field represented by the field lines (typically far field lines above the transmitter electrode 202 and receiver electrode 211) that extend past a touch surface 307. This interaction may cause a change in capacitive coupling between the transmitter electrode 202 and the receiver electrode 211. By measuring a resulting signal associated with the change in capacitive coupling, positional information for the input object 140 may be determined. However, a change in the amount of capacitive coupling between the transmitter electrode 202 and the receiver electrode 211 may also result when first the substrate 306 is deflected towards the second substrate 304, as depicted in FIGS. 3B and 4B and as described below.

Figure 4B:
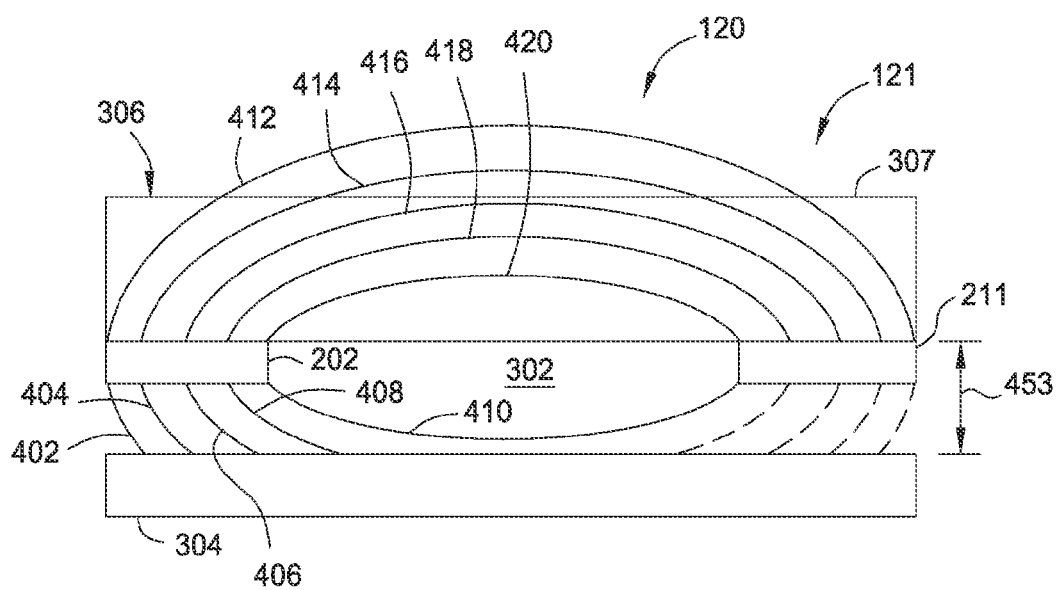
FIG. 4B is an enlarged view of a sensing element in the input device shown in FIG. 3B, having an amount of bending applied, according to one embodiment of the present invention.

FIG. 4B is an enlarged view of a sensing element in the input device shown in FIG. 3B, having an amount of bending applied, according to one embodiment of the present invention. First substrate 306 is at a second distance 453 from the second substrate 304, which is less than the first distance 403.

Dotted lines represent portions of electric field lines that would have formed if not for the proximity of the second substrate 304.

The geometry of the electric field lines shown in FIG. 4B, and thus resulting signals received from the receiver electrode 211, are affected by the distance 453. Specifically, field lines 404, 406, and 408 that couple the transmitter electrode 202 to the receiver electrode 211 in FIG. 4A instead couple the transmitter electrode 202 to the second substrate 304, due to distance 453. Consequently, the number of electric field lines that capacitively couple the transmitter electrode 202 to the receiver electrode 211 in FIG. 4B is smaller than the number of electric field lines that capacitively couple the transmitter electrode 202 to the receiver electrode 211 in FIG. 4A. Therefore, resulting signals received from the receiver electrode 211 when the first substrate 306 is at the second distance 453 from the second substrate 304 are different than the resulting signals received from the receiver electrode 211 when the first substrate 306 is at the first distance 403 from the second substrate 306. As can be seen, when the first substrate 306 is moved closer to the second substrate 304, an unwanted change in resulting signals may occur.

Traditionally, several options are available to minimize the change in resulting signals caused by movement of a first substrate 306 towards a second substrate 304. For example, in one traditional approach, either or both of a first substrate or a second substrate can be made thicker or more rigid to reduce deflection of a first substrate for a given amount of force. In another traditional approach, a shield layer is included, as is shown in FIGS. 5A and 5B.

Figure 5A:
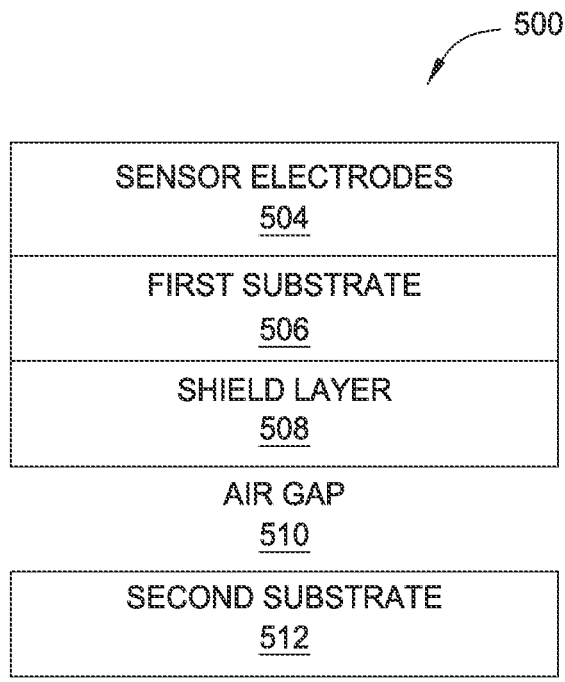
FIG. 5A illustrates a first input device including a shield layer for reducing capacitive coupling between sensor electrodes and a second substrate, according to one embodiment of the present invention.

FIG. 5A illustrates a first input device 500 including a shield layer 508 for reducing capacitive coupling between sensor electrodes 504 and a second substrate 512, according to one embodiment of the present invention. As shown, the input device 500 includes sensor electrodes 504, first substrate 506, shield layer 508, air gap 510, and second substrate 512.

Shield layer 508 serves to reduce capacitive coupling between sensor electrodes 504, which may include transmitter electrodes and receiver electrodes, and other components of the input device 500. For example, electric field lines that would extend from a sensor electrode in the sensor electrodes 504 to the second substrate 512 instead terminate on the shield layer 508 and therefore generally do not contribute to resulting signals. Therefore pressure applied to the input device 500, which might cause sensor electrodes 504 to be moved closer to second substrate 512, due to the presence of the compressible air gap 510, would not contribute to a change in a resulting signal that results from driving a transmitter electrode with a signal.

Figure 5B:
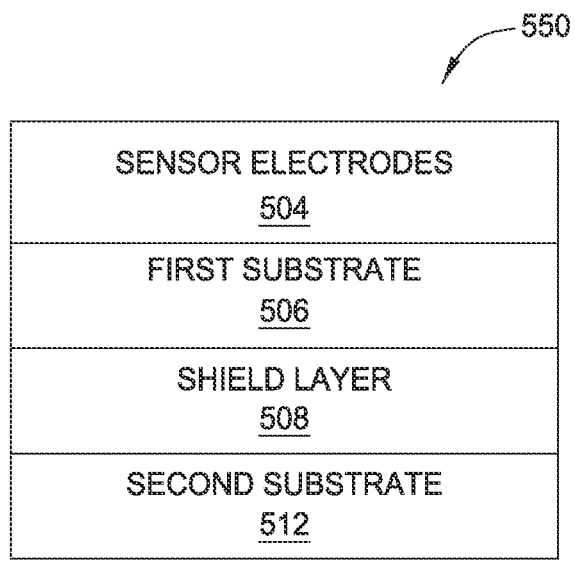
FIG. 5B illustrates a second input device including a shield layer for reducing capacitive coupling between sensor electrodes and a second substrate, according to one embodiment of the present invention.

FIG. 5B illustrates a second input device 550 including features for reducing bending effects, according to one embodiment of the present invention. As shown, the input device 550 includes sensor electrodes 504, first substrate 506, shield layer 508, and second substrate 512.

As with input device 500 illustrated in FIG. 5A, in input device 550, shield layer 508 serves to reduce electrical coupling between sensor electrodes 554 and other components of the input device 550. For example, electric field lines that would extend from a transmitter electrode to a second substrate instead terminate on the shield layer 508 and therefore do not contribute to resulting signals.

Although a shield layer 508 may reduce contributions to resulting signals from moving a first substrate towards a second substrate, shield layer 508 also adds to the thickness of the input device 500, 550. Because thickness is often a consideration in the design of input devices, an input device that does not have a shield layer 508, but that still experiences a reduced or absent bending effect, is desirable.

Figure 6:
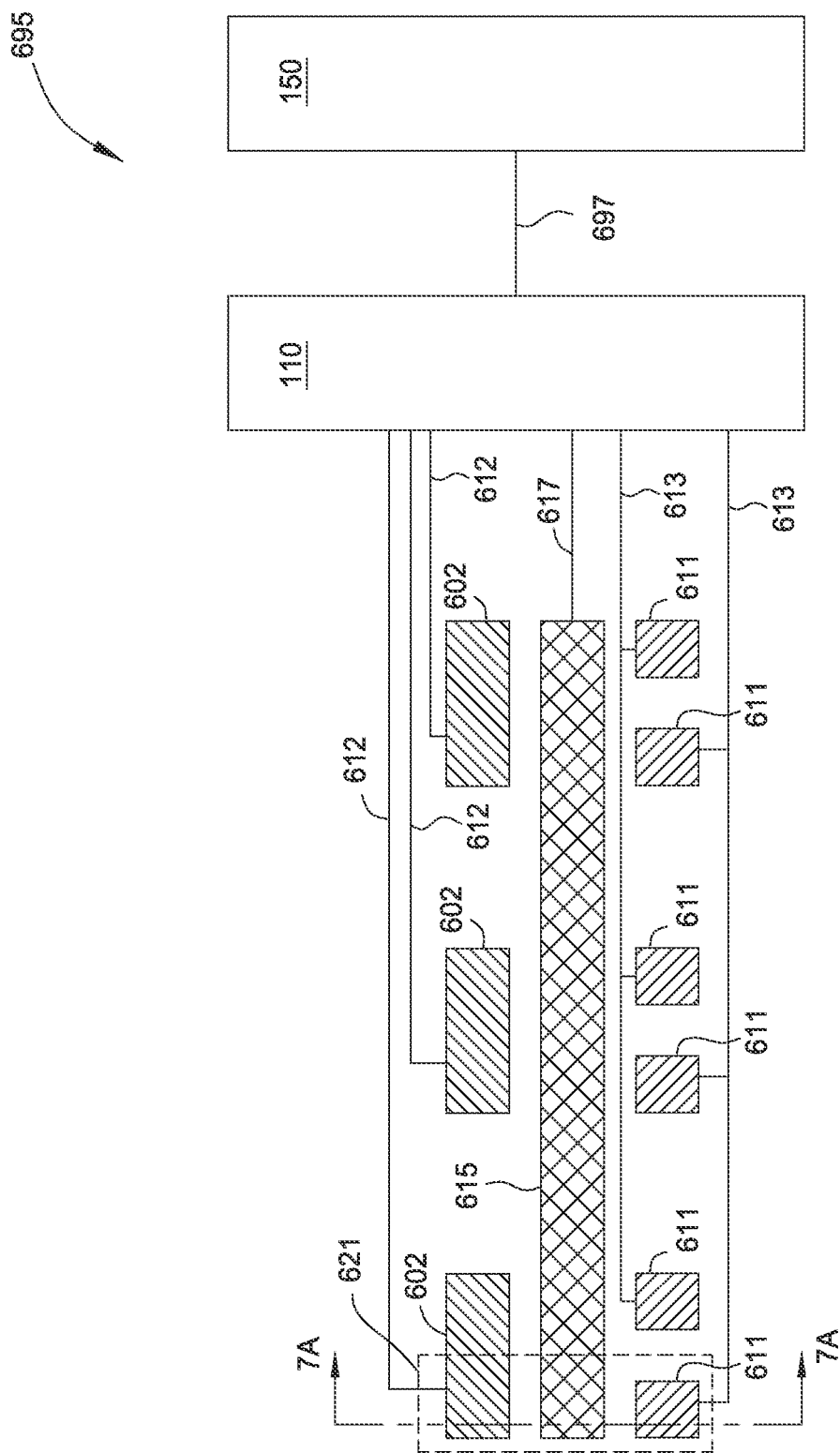
FIG. 6 is a schematic top view of an input device having a bending effect electrode, according to one embodiment of the present invention.

FIG. 6 is a schematic top view of an input device 695 having a bending effect electrode 615, according to one embodiment of the present invention. As shown, input device 695 includes transmitter electrodes 602, receiver electrodes 611, bending effect electrode 615, a processing system 110, and an electronic system 150.

The input device 695, which is not pictured in its entirety in FIG. 6, is similar to the input device 295, except that the input device 695 includes bending effect electrodes 615 disposed between transmitter electrodes 602 and receiver electrodes 611. Traces 612 couple transmitter electrodes 602 to processing system 110, traces 613 couple receiver electrodes 611 to processing system 110, and traces 617 couple bending effect electrode 615 to processing system 110. Electronic system 150 provides control signals to processing system 110 through conduit 697. Processing system 110 provides signals to, and receives signals from electrodes 602, 611, and 615. For transcapacitive sensing, processing system 110 drives transmitter electrodes 602 and receives resulting signals from receiver electrodes 611. The presence of bending effect electrode 615 between transmitter electrodes 602 and receiver electrodes 611 helps to reduce the magnitude of a change in resulting signals caused by a deflection of a first substrate towards a second substrate, as explained in greater detail below with reference to FIGS. 7A and 7B.

Figure 7A:
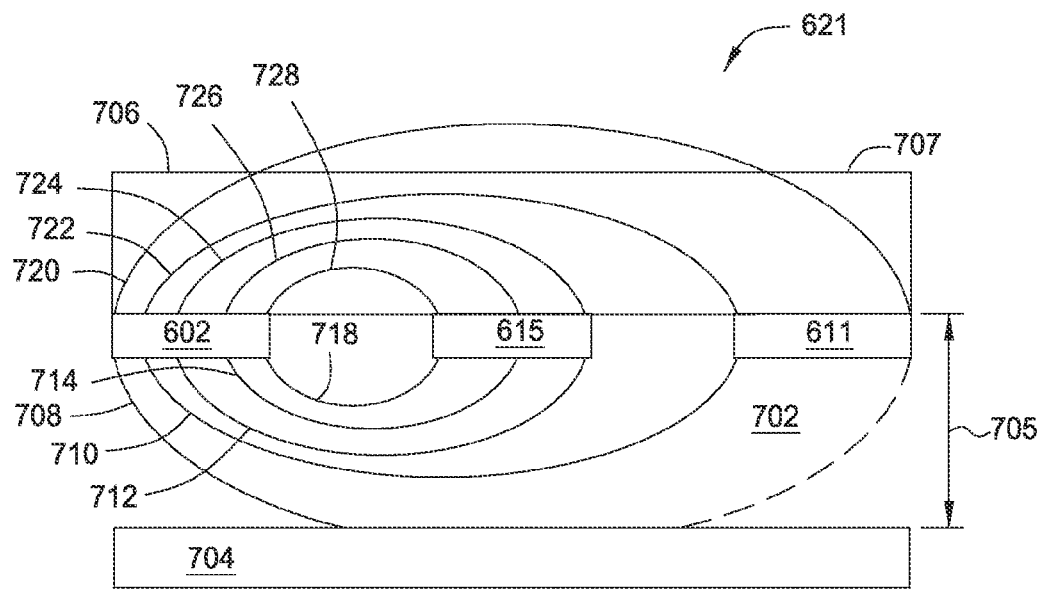
FIG. 7A is an enlarged view of a sensing element having a bending effect electrode, in the input device shown in FIG. 6, according to one embodiment of the present invention.

FIG. 7A is an enlarged view of a sensing element 621 having a bending effect electrode 615, in the input device 695 shown in FIG. 6, according to one embodiment of the present invention. As shown, the transmitter electrode 602, the bending effect electrode 615, and the receiver electrode 611 are disposed on the first substrate 706 and are all ohmically separated from each other. The first substrate 706 is spaced apart from, and at a first distance 705 from, the second substrate 704, to form a compressible region 702. The compressible region 702 may be an air gap or a compressible material.

As with sensing element 121 in FIGS. 4A and 4B, when the transmitter electrode 602 is driven with a transmitter signal, an electric field forms between the transmitter electrode 602 and other components in input device 695. In FIG. 7A, the electric field that forms is represented by field lines that may be categorized based on the components that the field lines extend from and to, and the elements through which the field lines extend. Field line 710 capacitively couples the transmitter electrode 602 and the receiver electrode 611 through the compressible region 702. Field line 708 capacitively couples the transmitter electrode 602 to the second substrate 704 through the compressible region 702. Field lines 712, 714, and 718 capacitively couple the transmitter electrode 602 to the bending effect electrode 615 through the compressible region. Field lines 720 and 722 capacitively couple the transmitter electrode 602 to the receiver electrode 611 through the first substrate 706. Finally, field lines 724, 726, and 728 capacitively couple the transmitter electrode 602 to the bending effect electrode 615 through the first substrate 706. Near field lines extend from the transmitter electrode 602 to the bending effect electrode 615, either above or below the electrodes 611, 602, but do not approach or extend past a touch surface 707, and include lines 712, 714, 718, 724, 726, and 728. Far field lines above the electrodes 602, 611 are lines that extend from the transmitter electrode 602 to the receiver electrode 611, and approach or extend past a touch surface 707, and include lines 722 and 720. Far field lines below the electrodes 602, 611 extend from the transmitter electrode 602 to the second substrate 704 or the receiver electrode 611 and include lines 710 and 708. Dotted lines represent portions of electric field lines that would have formed if not for the proximity of the second substrate 704.

The configuration of the field lines affects resulting signals received from receiver electrode. When the first substrate 706 is moved closer to the second substrate 704, several of the field lines, and thus the resulting signals, are affected, as described below in more detail with reference to FIG. 7B.

Figure 7B:
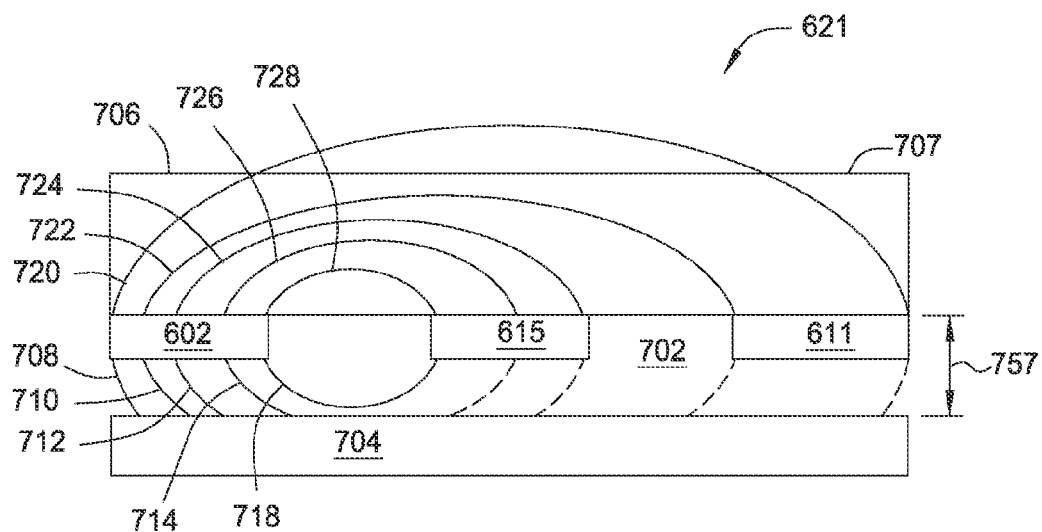
FIG. 7B illustrates the sensing element shown in FIG. 7A, having an amount of bending applied, according to one embodiment of the present invention.

FIG. 7B is an enlarged view of the sensing element 621 shown in FIG. 7A, having an amount of bending applied, according to one embodiment of the present invention. In FIG. 7B, the first substrate 706 is at a second distance 757 from the second substrate 704 that is less than the first distance 705 in FIG. 7A. Dotted lines represent portions of electric field lines that would have formed if not for the proximity of the second substrate 704.

Resulting signals received when the first substrate 706 is at the first distance 705 from the second substrate 704, as shown in FIG. 7A, differ from resulting signals received when the first substrate 704 is at the second distance 757 from the second substrate 704, as shown in FIG. 7B. This difference in resulting signals occurs because of a change in the number of electric field lines that capacitively couple the transmitter electrode 602 to the receiver electrode 611. More specifically, some electric field lines through the compressible region 702 that extend from the transmitter electrode 602 and terminate on the receiver electrode 611 in FIG. 7A instead terminate on the second substrate 704 in FIG. 7B. The magnitude of the difference in resulting signals is dependent on the number of electric field lines that extend from the transmitter electrode 602 and change from terminating on the receiver electrode 611 to terminating on the second substrate 704 when the first substrate 706 is moved closer to the second substrate 704.

The bending effect electrode 615 reduces the magnitude of this difference in resulting signals by reducing the number of electric field lines that extend from the transmitter electrode 602 and change from terminating on the receiver electrode 611 to terminating on the second substrate 704. More specifically, several electric field lines, including electric field lines 712, 714, and 718, terminate on the bending effect electrode 615 instead of the receiver electrode 611, and thus do not provide a contribution to the resulting signals. Because electric field lines 712, 714, and 718 do not provide a contribution to the resulting signals, they also do not provide a contribution to a change in resulting signals when the first substrate 706 is moved closer to the second substrate 704. Further, although electric field lines 712 and 714 change from terminating on the bending effect electrode 615 to terminating on the second substrate 704 when the first substrate 706 is moved closer to the second substrate 704, these electric field lines do not contribute to the difference in resulting signals received from the receiver electrode 611 when the first substrate 706 moves closer to the second substrate 706.

The effect of the bending effect electrode 615 is also seen with a comparison of FIGS. 4A, 4B, 7A, and 7B. While the first substrate 706 is at a first distance 705 from the second substrate 704, as shown in FIG. 7A, one electric field line—line 710—capacitively couples the transmitter electrode 602 to the receiver electrode 611 below the first substrate 706. In comparison, while the first substrate 706 is at a second distance 757 from the second substrate 704, as shown in FIG. 7B, zero electric field lines capacitively couple the transmitter electrode 602 to the receiver electrode 611. Therefore, with the bending effect electrode 615 present, one field line changes from terminating on the receiver electrode 611 to terminating on the second substrate 704. In contrast, in FIGS. 4A and 4B, when first substrate 306 moves from the position shown in FIG. 4A, to the position shown in FIG. 4B, three lines, lines 404, 406, and 408 change from terminating on receiver electrode 211 to terminating on second substrate 304. Thus the number of field lines that change from terminating on receiver electrode 611 to terminating on second substrate 704 in FIGS. 7A and 7B is less than the number that change in FIGS. 4A and 4B. Therefore, the change in resulting signal due to bringing the first substrate closer to the second substrate is reduced with the presence of the bending effect electrode 615, as compared with a configuration that does not include a bending effect electrode.

In various embodiments, bending effect electrode 615 can be driven with a reference voltage, such as system ground or another constant voltage. In other embodiments, bending effect electrode 615 can be driven with a varying voltage or synchronized with the sensing of the input device 695. In yet other embodiments, bending effect electrode 615 can be selectively electrically floating. In various embodiments, the electrical coupling between the transmitter electrode 602 and receiver electrode 611 may be measured and used to determine an input force or the effects of a non-conductive input object.

In various embodiments, dimensions and parameters of input device 695 may be varied to alter the change in capacitive coupling caused by deflection. In some embodiments, the parameters are selected such that the change in capacitive coupling caused by deflection is negligible, almost zero, or substantially less than a background noise level of a resulting signal.

While FIGS. 7A and 7B illustrate the transmitter electrode 602, the receiver electrode 611 and the bending effect electrode 615 disposed on the first substrate 706, in various other embodiments, the transmitter electrode 602, the receiver electrode 611, and the bending effect electrode 615 may be disposed on a separate substrate layer adhered to the first substrate 706. Further, the transmitter electrode 602, the receiver electrode 611, and the bending effect electrode 615 may be disposed such that they are between the separate substrate layer and the first substrate 706 or such that the separate substrate layer is between the electrodes 602, 611 and the first substrate 706. In yet other embodiments, the transmitter electrode 602, the receiver electrode 611 and the bending effect electrode 615 may be disposed such that an insulating layer (or substrate) is disposed between at least one of the transmitter electrode 602, the receiver electrode 611, and the bending effect electrode 615. In another embodiment, a bending effect electrode can be provided on the right side of the receiver electrode 611 to help reduce the change in resulting signals caused by a pressure on the input device 695.

Figure 8:
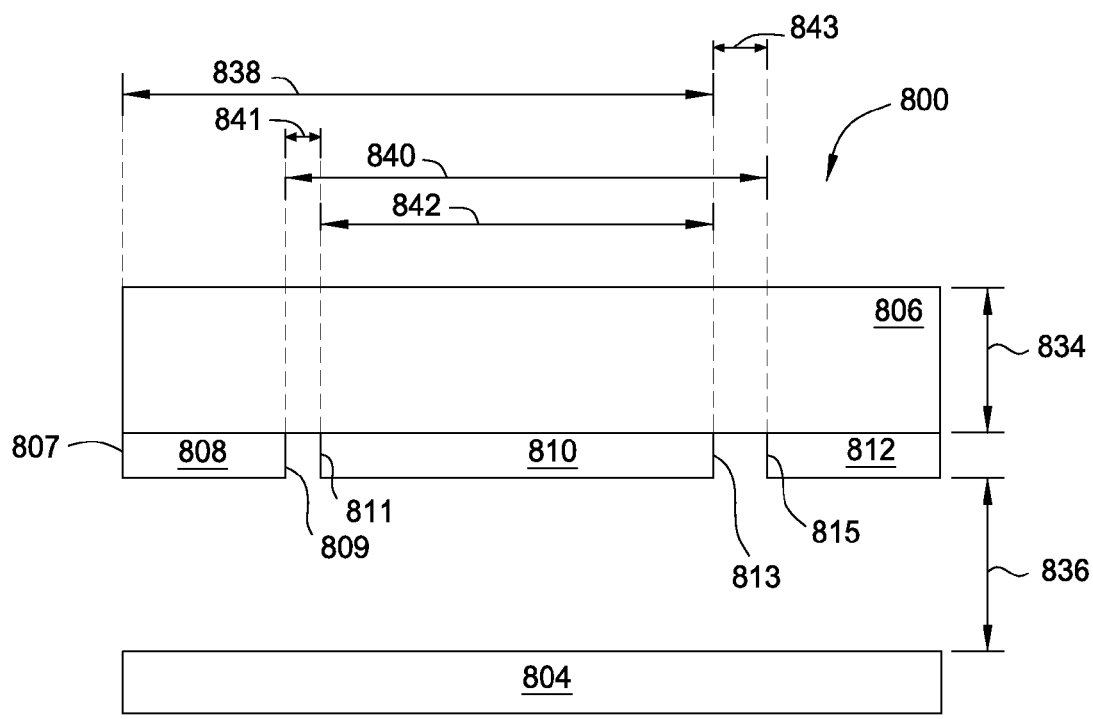
FIG. 8 illustrates an alternative embodiment of a sensing element having a bending effect electrode.

FIG. 8 illustrates an alternative embodiment of a sensing element 800 having a bending effect electrode 810. As shown, the sensing element 800 includes transmitter electrode 808, receiver electrode 812, bending effect electrode 810, first substrate 806, second substrate 804, and compressible region 802

Sensing element 800 has a similar configuration to sensing element 621, but several elements in sensing element 800 have different dimensions than elements in sensing element 621. In one embodiment, the bending effect electrode 810 has a width 842. In one embodiment, the transmitter electrode 808 is set apart from the receiver electrode by a distance 840. In one embodiment, a far edge 807 of the transmitter electrode 808 is at a distance 838 from a second edge 813 of the bending effect electrode 810. In one embodiment, the first substrate 806 defines a thickness 834. In one embodiment, the compressible region 802 defines a thickness 836. In one embodiment, a near edge 809 of the transmitter electrode 808 is at a distance 841 from the first edge 811 of the bending effect electrode 810. In one embodiment, the second edge 813 of the bending effect electrode 810 is at a distance 843 from the near edge 815 of the receiver electrode 812. Varying these dimensions 842, 840, 838, 834, 836, 841, and 843 can alter electrical characteristics of the sensing element 800.

For example, by increasing the width 842 of bending effect electrode 810, more electric field lines that extend from transmitter electrode 808 terminate on the bending effect electrode 810 instead of the receiver electrode 812. Therefore the change in resulting signal caused by movement of the first substrate 806 from a first position to a second position is reduced. In various embodiments, the width 842 of bending effect electrode 810 can be greater than approximately 25%, 30%, 40%, 50%, 60%, 70%, 80%, 90% or nearly 100% of the distance 840 between the transmitter electrode 808 and the receiver electrode 812.

In another example, the distance 838 from a far edge 807 of the transmitter electrode 808 to a second edge 813 of the bending effect electrode 810 can be varied. The number of field lines that extend past the first substrate 806, and thus contribute to a resulting signal in the presence of an input object, such as line 824, depends on distance 838. Therefore, distance 838 can be varied to affect the change in resulting signal caused by a deflection of the first substrate 806 towards the second substrate 804. In some embodiments, distance 838 is less than or equal to a thickness 834 of the first substrate 806 (or a distance from the top of the electrodes 808, 810, 812 to a touch surface in an embodiment in which more than one layer is provided between electrodes 808, 810, 812 and a touch surface).

In another example, thickness 836 of compressible region 802 can be varied. The number of field lines that extend from the transmitter electrode 808 to the receiver electrode 812, and thus contribute to resulting signals, depends on thickness 836. With a smaller thickness 836, more field lines that extend from the transmitter electrode 808 terminate on the second substrate 804. With more field lines that terminate on the second substrate 804, fewer field lines terminate on the receiver electrode 812, and therefore fewer field lines contribute to a resulting signal when transmitter electrode 808 is driven. Similarly, with a large thickness 836, fewer field lines that extend from the transmitter electrode 808 terminate on second substrate 804, and more field lines that extend from the transmitter electrode 808 terminate on the receiver electrode 812. Therefore, more field lines contribute to a resulting signal when the transmitter electrode 808 is driven. Advantageously, the number of field lines that terminate on the receiver electrode 812 is small, so that the change in the number of field lines that terminate on the receiver electrode 812, and thus the change in resulting signal when the first substrate 806 is deflected towards the second substrate 804, is small. In some embodiments, the thickness 836 of the compressible region 802 is less than or equal to the distance 838 from the far edge 807 of the transmitter electrode 808 to the second edge 813 of the bending electrode.

In some embodiments, multiple bending effect electrodes 810 may be disposed between transmitter electrode 808 and receiver electrode 812. In such embodiments, the shape, size, and position of each bending effect electrode may be varied.

Figure 9B:
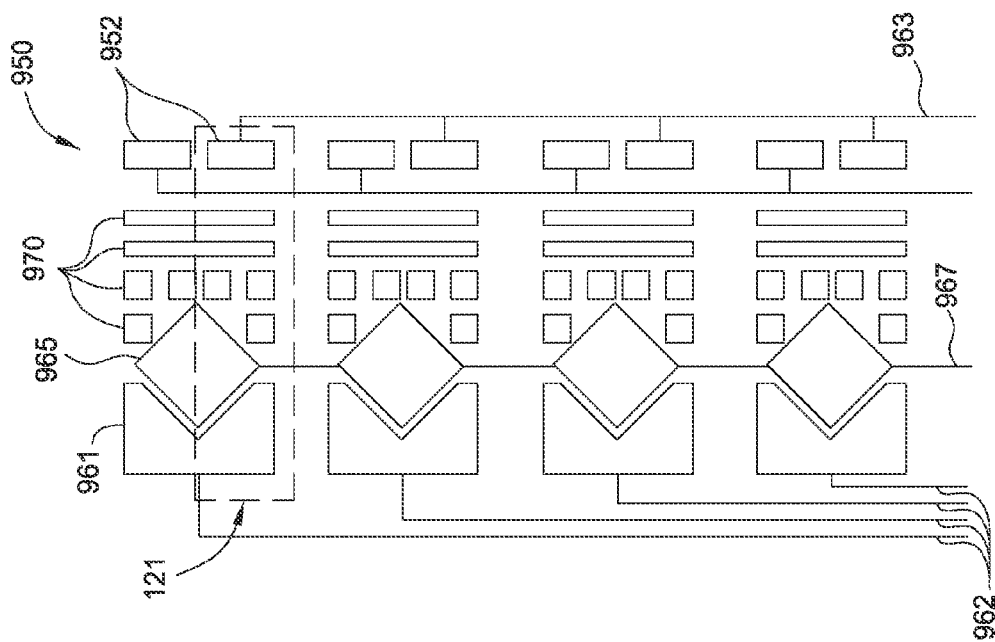
FIGS. 9A-9B illustrate alternative embodiments of a sensor electrode pattern.
Figure 9A:
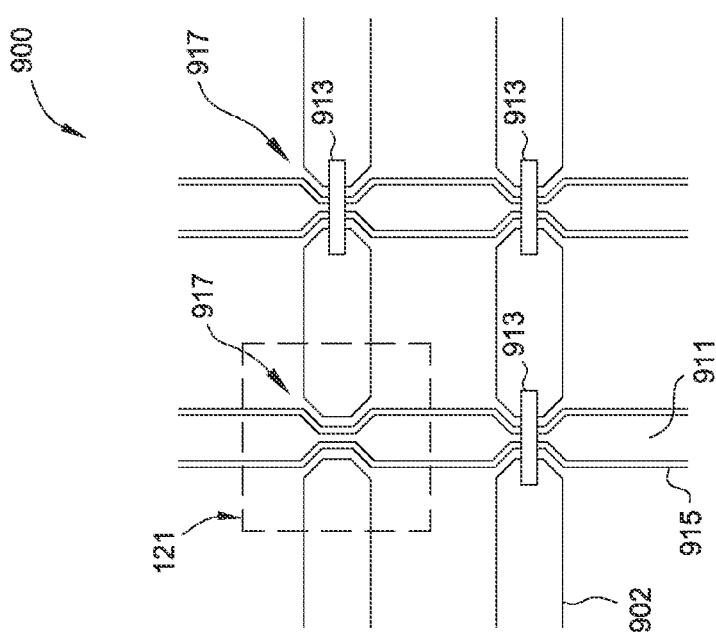

FIGS. 9A and 9B present alternate embodiments of a sensor electrode pattern.

FIG. 9A illustrates an electrode arrangement 900, according to one embodiment of the present invention. As shown, the electrode arrangement 900 includes transmitter electrodes 902, receiver electrodes 911, and bending effect electrodes 915.

Transmitter electrodes 902 are arranged in rows. Receiver electrodes 911 are arranged perpendicularly to the transmitter electrodes 902 but do not contact the transmitter electrodes 902. Rather, the receiver electrodes 911 lie within gaps between the transmitter electrodes 902. A sensing element 121 is formed in the area around these gaps. Within sensing element 121, transmitter electrodes 911 are spaced apart from receiver electrodes 902. Bending effect electrode 915 is disposed between transmitter electrodes 911 and receiver electrodes 902. Jumpers 913 allow transmitter electrodes 911 to be connected across neck 917 without interrupting bending effect electrode 915 or receiver electrode 902.

FIG. 9B illustrates an electrode arrangement 950, according to another embodiment of the present invention. As shown, the electrode arrangement 950 includes transmitter electrodes 961, receiver electrodes 952, bending effect electrodes 965, and floating electrodes 970.

Within sensing element 121, transmitter electrodes 961 are spaced apart from receiver electrodes 952. Bending effect electrode 965 is disposed between transmitter electrodes 961 and receiver electrodes 952. Floating electrodes 970 are present to increase electrical coupling between transmitter electrode 961 and receiver electrode 952. Traces 962, 967, and 963 provide signals to and receive signals from transmitter electrodes 961, bending effect electrodes 965, and receiver electrodes 952, respectively.

While the sensor electrodes and sensor electrode elements disclosed herein may be illustrated as having specific shapes and sizes, these specific illustrations are not intended to be limiting. In various embodiments, the sensor electrodes and sensor electrode elements may have any other shape that is able to provide the necessary capacitive coupling and response. In yet other embodiments, the sensor electrodes and sensor electrodes elements may be any size, such that they provide the necessary capacitive coupling and response.

The embodiments and examples set forth herein were presented in order to best explain the present technology and its particular application and to thereby enable those skilled in the art to make and use the present technology. Those skilled in the art will recognize that the foregoing description and examples have been presented for the purposes of illustration and example only. The description as set forth is not intended to be exhaustive or to limit the present technology to the precise form disclosed. While the foregoing is directed to embodiments of the present invention, other and further embodiments of the invention may be devised without departing from the basic scope thereof, and the scope thereof is determined by the claims that follow.

The invention claimed is:

1. A capacitive image sensor for detecting an input object, comprising:
    a first substrate having a first side;
    a second substrate displaced from the first substrate to define a compressible region between the first substrate and the second substrate, wherein the first substrate is deflectable relative to the second substrate between a first position in which the compressible region has a first thickness and a second position in which the compressible region has a second thickness that is less than the first thickness;
    a transmitter electrode disposed on the first substrate, the transmitter electrode configured to transmit a transmitter signal;
    a receiver electrode disposed on the first substrate and configured to receive a resulting signal comprising effects corresponding to the transmitter signal; and a bending effect electrode disposed on the first substrate and disposed between the transmitter electrode and the receiver electrode, wherein when the first substrate is in the first position, a plurality of field lines associated with the resulting signal extends from the transmitter electrode through the compressible region and terminates on the bending effect electrode, and when the first substrate is in the second position, the plurality of field lines extends from the transmitter electrode through the compressible region and terminates on the second substrate.

2. The capacitive image sensor of claim 1, wherein the compressible region is an air gap.

3. The capacitive image sensor of claim 1, wherein the second substrate is a ground plane.

4. The capacitive image sensor of claim 1, wherein the second substrate is a surface of a display.

5. The capacitive image sensor of claim 1, wherein the second substrate is a common voltage electrode.

6. The capacitive image sensor of claim 1, wherein no shield layer is disposed between the second substrate and the transmitter electrode, the receiver electrode, and the bending effect electrode.

7. The capacitive image sensor of claim 1, wherein:
the transmitter electrode has a near edge and a far edge,
the bending effect electrode has a first edge disposed proximate to the near edge of the transmitter electrode and a second edge disposed proximate to the receiver electrode, and
the bending effect electrode is configured such that a distance between the far edge of the transmitter electrode and the second edge of the bending effect electrode is less than or equal to a distance from the transmitter electrode to a touch surface.

8. The capacitive image sensor of claim 1, wherein:
the transmitter electrode has a near edge and a far edge,
the bending effect electrode has a first edge disposed proximate to the near edge of the transmitter electrode and a second edge disposed proximate to the receiver electrode, and
the first thickness of the compressible region is less than or equal to a distance between the far edge of the transmitter electrode and the second edge of the bending effect electrode.

9. The capacitive image sensor of claim 1, wherein:
the transmitter electrode has a near edge and a far edge,
the bending effect electrode has a first edge disposed proximate to the near edge of the transmitter electrode, a second edge disposed proximate to the receiver electrode, and a width defined as a distance from the first edge to the second edge, and
the width of the bending effect electrode is at least 25 percent of a distance between the transmitter electrode and the receiver electrode.

10. The capacitive image sensor of claim 1, wherein a number of field lines in the compressible region that extend from the transmitter electrode to the receiver electrode is substantially constant when the first substrate is in the first position as compared to when the first substrate is in the second position.

11. An input device comprising:
a first substrate having a first side;
a second substrate displaced from the first substrate to define a compressible region between the first substrate and the second substrate, wherein the first substrate is deflectable between a first position in which the compressible region has a first thickness and a second position in which the compressible region has a second thickness that is less than the first thickness;
a plurality of sensing elements, each sensing element comprising a transmitter electrode disposed on the first substrate, a receiver electrode disposed on the first substrate and spaced apart from the transmitter electrode, and a bending effect electrode disposed on the first substrate and disposed between the transmitter electrode and the receiver electrode; and
a processing system communicatively coupled to the transmitter electrodes and to the receiver electrodes, and configured to drive the transmitter electrodes with transmitter signals for capacitive sensing and to receive resulting signals the receiver electrodes when the transmitter electrodes are driven for capacitive sensing, the resulting signals comprising effects corresponding to the transmitter signals,
wherein each bending effect electrode is configured such that when the first substrate is in the first position, a plurality of field lines associated with the resulting signals extends from the transmitter electrode through the compressible region and terminate on the bending effect electrode, and when the first substrate is in the second position, the plurality of field lines extends from the transmitter electrode through the compressible region and terminate on the second substrate.

12. The input device of claim 11, wherein for each sensing element, the transmitter electrode has a near edge and a far edge, the bending effect electrode has a first edge disposed proximate to the near edge of the transmitter electrode and a second edge disposed proximate to the receiver electrode, and the bending effect electrode is configured such that a distance between the far edge of the transmitter electrode and the second edge of the bending effect electrode is less than or equal to a distance from the transmitter electrode to a touch surface.

13. The input device of claim 11, wherein for each sensing element, the transmitter electrode has a near edge and a far edge, the bending effect electrode has a first edge disposed proximate to the near edge of the transmitter electrode and a second edge disposed proximate to the receiver electrode, and the first thickness of the compressible region is less than or equal to a distance between the far edge of the transmitter electrode and the second edge of the bending effect electrode.

14. The input device of claim 11, wherein for each sensing element, the transmitter electrode has a near edge and a far edge, the bending effect electrode has a first edge disposed proximate to the near edge of the transmitter electrode and a second edge disposed proximate to the receiver electrode, the bending effect electrode has a width that is equal to a distance from the first edge to the second edge, and the width of the bending effect electrode is at least 25 percent of a distance between the transmitter electrode and the receiver electrode.

15. The input device of claim 11, wherein for each sensing element, a number of field lines in the compressible region that extend from the transmitter electrode to the receiver electrode is substantially constant when the first substrate is in the first position as compared to when the first substrate is in the second position.

16. The input device of claim 11, wherein no shield layer is disposed between the second substrate and the transmitter electrodes, the receiver electrodes, and the bending effect electrodes.

17. The input device of claim 11, wherein the processing system is configured to drive the bending effect electrode at a ground voltage while receiving a resulting signal with the receiver electrode.

18. The input device of claim 11, wherein the processing system is configured to drive the bending effect electrode is at a reference voltage while receiving a resulting signal with the receiver electrode.

19. The input device of claim 11, wherein the processing system is configured to drive the bending effect electrode with a varying voltage while receiving a resulting signal with the receiver electrode.

20. The input device of claim 11, wherein the compressible region is an air gap.

21. A capacitive image sensor for detecting an input object, comprising:
 a first substrate having a first side;
 a second substrate displaced from the first substrate to define a compressible region between the first substrate and the second substrate, wherein the first substrate is deflectable relative to the second substrate between a first position in which the compressible region has a first thickness and a second position in which the compressible region has a second thickness that is less than the first thickness;
 a transmitter electrode disposed on the first substrate, the transmitter electrode configured to transmit a transmitter signal;
 a receiver electrode disposed on the first substrate and configured to receive a resulting signal comprising effects corresponding to the transmitter signal; and
 a bending effect electrode disposed on the first substrate and disposed between the transmitter electrode and the receiver electrode,
 wherein the bending effect electrode is configured to reduce an amount of change in capacitive coupling associated with the resulting signal between the transmitter electrode and the receiver electrode that occurs when the first substrate is deflected from the first position to the second position.

22. The capacitive image sensor of claim 21, wherein:
 the transmitter electrode has a near edge and a far edge,
 the bending effect electrode has a first edge disposed proximate to the near edge of the transmitter electrode and a second edge disposed proximate to the receiver electrode, and
 the bending effect electrode is configured such that a distance between the far edge of the transmitter electrode and the second edge of the bending effect electrode is less than or equal to a distance from the transmitter electrode to a touch surface.

23. The capacitive image sensor of claim 21, wherein:
 the transmitter electrode has a near edge and a far edge,
 the bending effect electrode has a first edge disposed proximate to the near edge of the transmitter electrode and a second edge disposed proximate to the receiver electrode, and
 the first thickness of the compressible region is less than or equal to a distance between the far edge of the transmitter electrode and the second edge of the bending effect electrode.

24. The capacitive image sensor of claim 21, wherein:
 the transmitter electrode has a near edge and a far edge,
 the bending effect electrode has a first edge disposed proximate to the near edge of the transmitter electrode, a second edge disposed proximate to the receiver electrode, and a width defined as a distance from the first edge to the second edge, and the width of the bending effect electrode is at least 25 percent of a distance between the transmitter electrode and the receiver electrode.

* * * * *